United States Patent
Kadota

(10) Patent No.: US 6,587,016 B2
(45) Date of Patent: Jul. 1, 2003

(54) SURFACE ACOUSTIC WAVE FILTER WITH ANGLED REFLECTION BY PIEZOELECTRIC SUBSTRATE REFLECTION EDGES, DUPLEXER, AND COMMUNICATION DEVICE

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/836,072

(22) Filed: Apr. 17, 2001

(65) Prior Publication Data
US 2001/0035802 A1 Nov. 1, 2001

(30) Foreign Application Priority Data
Apr. 26, 2000 (JP) ........................................ 2000-125892

(51) Int. Cl.[7] .............................. H03H 9/64; H03H 9/72
(52) U.S. Cl. ........................ 333/133; 333/193; 333/195; 310/313 B; 310/313 D; 310/367
(58) Field of Search .......................... 333/133, 193–196; 310/313 R, 313 B, 313 C, 313 D, 367

(56) References Cited
U.S. PATENT DOCUMENTS 3,753,164 A * 8/1973 De Vries ..................... 333/153
4,204,178 A * 5/1980 Mitchell ................... 333/196 X
4,965,479 A * 10/1990 Elliott et al. ............. 333/195 X
5,365,206 A * 11/1994 Machui et al. ............... 333/195
6,127,769 A * 10/2000 Kadota et al. ........... 333/193 X

FOREIGN PATENT DOCUMENTS

EP  1 071 207 A2  1/2001
JP  11-27093    *  1/1999

* cited by examiner

Primary Examiner—Barbara Summons
(74) Attorney, Agent, or Firm—Keating & Bennett, LLP

(57) ABSTRACT

A surface acoustic wave filter includes a piezoelectric substrate and first and second IDT provided thereon. The first IDT is formed on the surface of the piezoelectric substrate. The second IDT is formed on the surface of the piezoelectric substrate and positioned not in a straight line with the first IDT in the surface acoustic wave propagation direction. A first reflection edge is formed on the piezoelectric substrate, and positioned in a straight line with the first IDT in the surface acoustic wave propagation direction so that an SH type surface acoustic wave excited by the first IDT is input to the first reflection edge and is reflected therefrom at an angle to the input direction. A second reflection edge is formed on the piezoelectric substrate and positioned in a straight line with the second IDT in the surface acoustic wave propagation direction, so that the SH type surface acoustic wave reflected from the first reflection edge is input to the second reflection edge and is reflected therefrom at an angle to the input direction, toward the second IDT.

16 Claims, 4 Drawing Sheets

SURFACE ACOUSTIC WAVE FILTER WITH ANGLED REFLECTION BY PIEZOELECTRIC SUBSTRATE REFLECTION EDGES, DUPLEXER, AND COMMUNICATION DEVICE

BACKGROUND OF THE INVENTION

1. Field of the Invention

The present invention relates to a surface acoustic wave filter in which the propagation direction of a surface acoustic wave can be varied by use of a reflection edge, and especially which has excellent reflection efficacy and a very small chip size.

2. Description of the Related Art

Conventionally, surface acoustic wave devices have been used as IF filters for mobile communication equipment. Such surface acoustic wave filters include double mode surface acoustic wave devices operable in a double mode using longitudinally coupled or transversely coupled are used. In such surface acoustic wave devices, the pass-band width of the filter is significantly affected by the electromechanical coupling coefficient of a material for a piezoelectric substrate used in a surface acoustic wave filter. Therefore, the pass-band width of the filter can not be significantly changed by arrangement and configuration of electrodes such as interdigital electrodes (IDTs), reflectors, or other elements.

In recent years, ring pass filters, Z pass filters, or other filters have been attractive because the filter pass-band widths can be varied by arrangement and configuration of the IDTs, reflectors, or other elements.

FIG. 5 is a plan view of a ring pass filter 101.

As shown in FIG. 5, first and second IDTs 103 and 104, first reflectors 103a and 103b, and second reflectors 104a and 104b are disposed on a piezoelectric substrate 102.

One of the interdigital electrodes of the first IDT 103 is connected to an input terminal 105, and the other interdigital electrode is grounded. One of the interdigital electrodes of the second IDT 104 is connected to an output terminal 106, and the other interdigital electrode is grounded.

The first reflectors 103a and 103b are arranged to sandwich the IDT 103 and are arranged along a line with the IDT 103. The reflectors 103a and 103b are arranged to have inclined shapes to reflect a surface acoustic wave excited by the first IDT perpendicularly to the input direction to the respective reflectors.

The second reflectors 104a and 104b are arranged to sandwich the second IDT 104 along a straight line with each other, in the surface acoustic wave propagation direction. Moreover, the reflectors 104a and 104b are arranged to have inclined shapes to reflect a surface acoustic wave reflected by the first reflectors perpendicularly to the input direction to the respective reflectors, that is, toward the second IDT 104.

In the conventional ring pass filter or Z pass filter having such a configuration as described above, Rayleigh waves are used as a surface acoustic wave to be propagated.

In the case of Rayleigh waves, a large number of the electrode fingers constituting a reflector are required. The reflection coefficient of the above-mentioned reflector is considerably varied depending on the respective factors such as materials for the substrate, cut angles, propagation directions, materials for the electrodes, electrode thicknesses, wavelengths for the electrode fingers, widths of the electrode fingers, and other factors. Thus, it is very difficult to make an optimum design for a surface acoustic wave filter such as a ring pass filter, a z pass filter, or other filter. It takes a great amount of time to achieve the optimum design.

Furthermore, when a reflector for use with a Rayleigh wave, having the above-described structure is used, the reflection efficiency is low. Thus, there arises a problem that only surface acoustic wave devices having a low energy efficiency can be produced.

Moreover, in a filter having a conventional structure, the reflector has a predetermined frequency characteristic. Accordingly, in order to match the frequency characteristic with that of the IDT, it is required that the number of the reflectors should be a predetermined value or higher. For example, at least 80 reflectors are required for 100 MHz to 300 MHz. Accordingly, in the filter having the conventional structure, the required number of reflectors is large, and simultaneously, the lengths of the reflectors become larger. Thus, since there are time delays between surface acoustic waves reflecting from the respective electrode fingers constituting the reflectors, problematically, deviations between the group delay time characteristics become large.

In particular, as shown in FIG. 6, the group delay time characteristic (D) in the pass-band of the frequency characteristic (C) of the filter tends to be increased at both of the ends thereof. The deviation at the center frequency ±3 MHz is about 100 nS.

Moreover, the larger the above-described deviation of the group delay time characteristic (D) becomes, the more the phase of a signal changes. Thus, there arises the problem that moderate response to an input signal can not be obtained. Accordingly, in a communication device containing such a surface acoustic wave filter, for example, in a communication device such as a digital system portable telephone, there is the danger that a voice is interrupted, or no voice is output during call, though a radio wave is received.

Moreover, the surface acoustic wave filter experiences the problem that since the length of the reflector itself becomes large, the overall length of the filter is increased. This is an obstacle to miniaturization of the surface acoustic wave filter.

SUMMARY OF THE INVENTION

In order to solve the problems described above, preferred embodiments of the present invention provide a surface acoustic wave filter in which deviation of the group delay time characteristic is minimized, and miniaturization can be easily achieved.

According to a preferred embodiment of the present invention, a surface acoustic wave filter includes a piezoelectric substrate and first and second IDT provided thereon. The first IDT is disposed on the surface of the piezoelectric substrate. The second IDT is disposed on the surface of the piezoelectric substrate and is not arranged along a straight line with the first IDT in the surface acoustic wave propagation direction. A first reflection edge is provided on the piezoelectric substrate, and positioned along a straight line with the first IDT in the surface acoustic wave propagation direction so that a Shear Horizontal ("SH type") type surface acoustic wave excited by the first IDT is input to the first reflection edge and is reflected therefrom at an angle relative to the input direction. A second reflection edge is provided on the piezoelectric substrate and arranged along a straight line with the second IDT in the surface acoustic wave propagation direction, so that the SH type surface acoustic wave reflected from the first reflection edge is input to the second reflection edge and is reflected therefrom at an angle relative to the input direction, toward the second IDT.

The distance between the center of the first reflection edge and the center of the second reflection edge of the piezoelectric substrate is preferably substantially equal to approximately $\lambda/2 \times n$ (n is an integer) $\pm \lambda/8$, in which $\lambda$ represents the wavelength of a surface acoustic wave propagating the piezoelectric substrate.

The distance between the center of the outermost electrode finger in the first IDT and the center of the first reflection edge, or the distance between the center of the outermost electrode finger in the second IDT and the center of the second reflection edge is preferably substantially equal to approximately $\lambda/2 \times m$ (m is an integer) $\pm \lambda/8$, in which $\lambda$ represents the wavelength of a surface acoustic wave propagating the piezoelectric substrate.

The surface acoustic wave filter of preferred embodiments of the present invention can be incorporated in a duplexer, and a communication device using such a duplexer.

According to preferred embodiments of the present invention, no reflector having a plurality of electrodes is required. As a result, it is not necessary to determine the many parameters required for design of the reflector. Thus, the filter design process for preferred embodiments of the present invention is very easy, efficient and not time consuming.

According to preferred embodiments of the present invention, a surface acoustic wave filter such as a ring-pass filter, a Z pass filter, or other filter is configured so that a surface acoustic wave is reflected from reflection edges. Therefore, there is much less difference between the delay times of surface acoustic waves propagated from a reflection edge to the IDT on the output side. Thus, the group delay time characteristic becomes flat, and the deviation can be reduced.

Moreover, the reflection edges have a higher reflection efficiency as compared with a reflector including electrode fingers. Thus, the loss caused by the reflection elements is eliminated, and moreover, the propagation loss is very low, since the propagation distance of an SH wave is very short. Thereby, the insertion loss can be improved. Moreover, as the reflection parts, the reflection edges are employed instead of the reflectors. Thereby, the filter can be easily reduced in size.

Other features, elements, characteristics and advantages of the present invention will become more apparent from the following detailed description of preferred embodiments with reference to the attached drawings.

For the purpose of illustrating the invention, there is shown in the drawings several forms which are presently preferred, it being understood, however, that the present invention is not limited to the precise arrangements and instrumentalities shown.

DETAILED DESCRIPTION OF PREFERRED EMBODIMENTS

Hereinafter, preferred embodiments of the present invention will be described with reference of the drawings.

Figure 1:
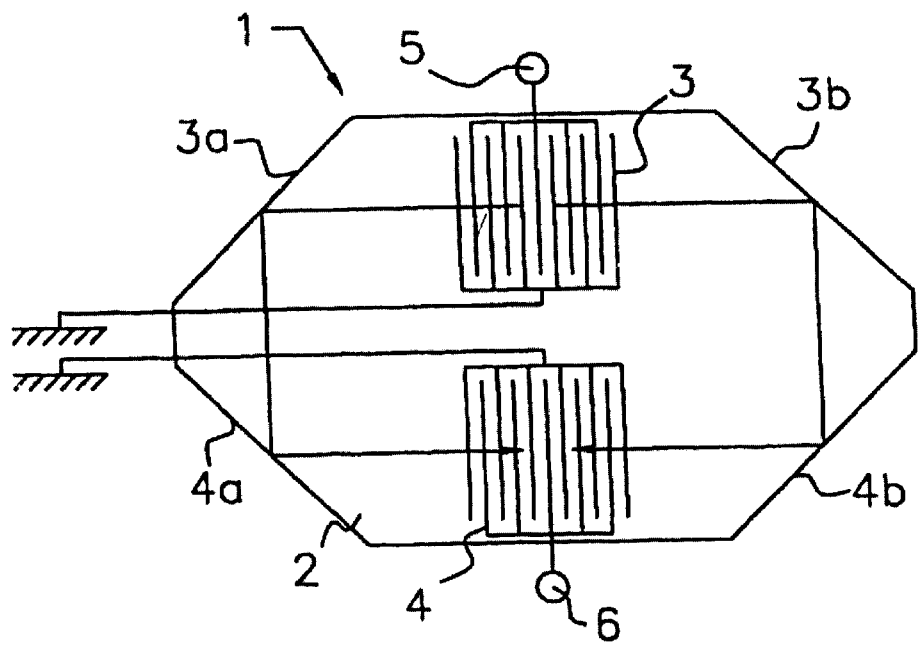
FIG. 1 is a plan view of a surface acoustic wave filter according to a first preferred embodiment of the present invention.

FIG. 1 is a plan view of a surface acoustic wave filter according to a first preferred embodiment of the present invention.

The surface acoustic wave filter 1 includes a piezoelectric substrate 2, a first IDT 3, and a second IDT 4. Each of the first and second IDTs 3, 4 has a pair of interdigital electrodes and is provided on the piezoelectric substrate 2. The first and second IDTs 3 and 4 are preferably made of an electrode material such as Al or other suitable material. The piezoelectric substrate 2 is preferably made of a piezoelectric ceramic or other suitable material and is polarized in a direction that is substantially parallel to a surface thereof, for example. The piezoelectric substrate 2 has first reflection edges 3a and 3b and second reflection edges 4a and 4b.

The first IDT 3 and the second IDT 4 are arranged in a direction that is substantially perpendicular to the propagation direction of a surface acoustic wave. One of the interdigital electrodes of the first IDT 3 is connected to an input terminal 5, and the other interdigital electrode is grounded. One of the interdigital electrodes of the second IDT 4 is connected to an output terminal 6, and the other interdigital electrode is grounded.

The reflection end surfaces 3a and 3b are inclined in the plan view of the piezoelectric substrate 2 and are provided on both of the sides of the first IDT 3. The reflection end surfaces 3a and 3b are arranged to have an angle at which surface acoustic waves excited by the first IDT 3 can be reflected from the reflection end surfaces 3a and 3b in the reflection directions that are about 90° different from the directions of incidence to the reflection end surfaces 3a and 3b, respectively, to be propagated. Moreover, reflection end surfaces 4a and 4b are inclined in the plan view of the piezoelectric substrate 2 and are provided on both of the sides of the second IDT 4. The reflection end surfaces 4a and 4b are arranged to have an angle at which surface acoustic waves excited by the first IDT 3 and reflected from the reflection end surfaces 3a and 3b while the directions are changed by about 90° from the incident directions, are reflected from the reflection end surfaces 4a and 4b in the directions changed by about 90° from the directions of incidence to the reflection end surfaces 4a and 4b, and are received by the second IDT 4, respectively.

Moreover, the distances between the centers of the first reflection edges 3a and 3b and those of the second reflection edges 4a and 4b are preferably about $\lambda/2 \times n$ (where n is an integer) $\pm \lambda/8$, respectively. The symbol "$\lambda$" represents the wavelength of a surface acoustic wave to be propagated on the piezoelectric substrate 2. Furthermore, the term "the centers of the reflection edges" means "the centers of the reflection edges extending along a line, respectively, in the plan view of the piezoelectric substrate 2, e.g., shown in FIG. 1". The phases of the propagating surface acoustic waves are matched, and unnecessary spurious radiation is reduced by regulating the distances between the centers of the first reflection edges 3a and 3b and the centers of the second reflection edges 4a and 4b of the piezoelectric substrate 2, respectively.

Moreover, the distances between the centers of the outermost electrode fingers of the first IDT 3 and the centers of the first reflection edges 3a and 3b, and the distances between the centers of the outermost electrode fingers of the second IDT 4 and the centers of the second reflection edges 4a and 4b are preferably about $\lambda/2 \times m$ (m is an integer) $\pm \lambda/8$, respectively. The symbol "$\lambda$" represents the wavelength of a surface acoustic wave to be propagated on the piezoelectric substrate 2. Moreover, the term "the outermost electrode fingers of the IDT" means "the electrode fingers nearest to the reflection edges, respectively, of the electrode fingers constituting the IDT, respectively". The term "the centers of the reflection edges" means "the centers of the reflection edges extending along a line, respectively, in the plan view of the piezoelectric substrate 2, e.g., shown in FIG. 1".

The phases of the propagating surface acoustic waves are matched, and unnecessary spurious radiation is reduced by regulating the distances between the centers of the first reflection edges 3a and 3b and the centers of the second reflection edges 4a and 4b of the piezoelectric substrate 2, respectively.

In the above-described surface acoustic wave filter 1, a surface acoustic wave is propagated as indicated by an arrow in FIG. 1. In particular, a signal is input via the input terminal 5, is excited by the first IDT 3, are propagated on both sides of the first IDT 3, and are reflected from the reflection edges 3a and 3b in the directions that are changed by about 90°. Furthermore, the surface acoustic waves reflected from the reflection edges 3a and 3b are reflected from the reflection edges 4a and 4b in the direction changed by about 90°, are received by the second IDT 4, and are output from an output terminal 6.

Figure 2:
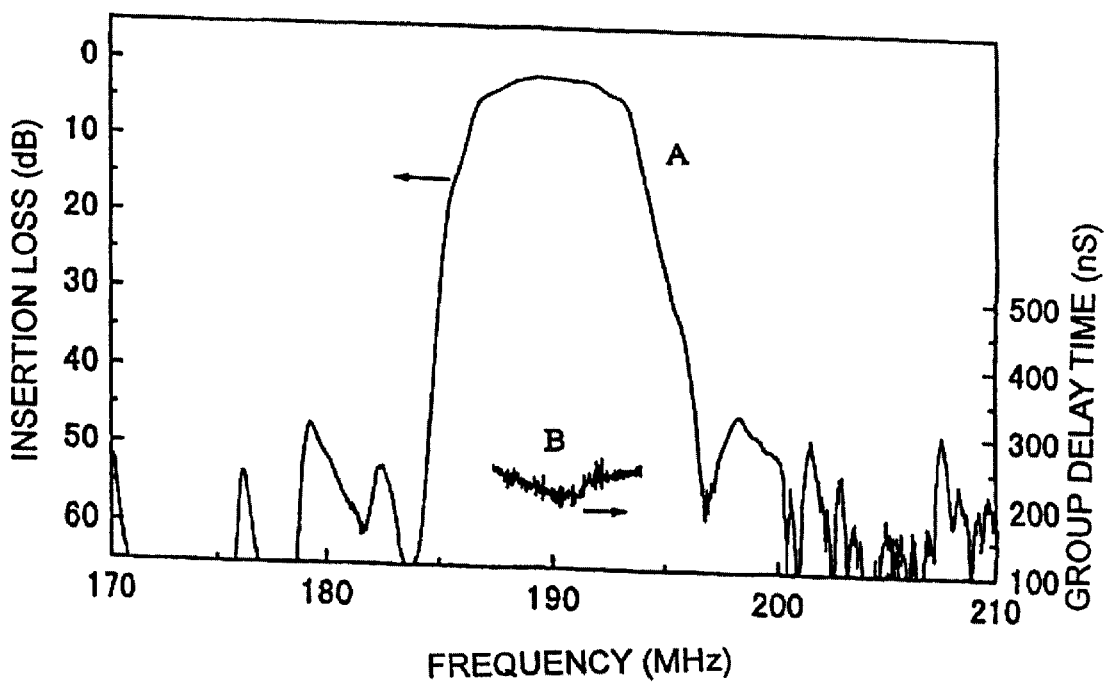
FIG. 2 is a characteristic graph showing the frequency characteristic and the group delay time characteristic of the surface acoustic wave of the first preferred embodiment of the present invention.
Figure 5:
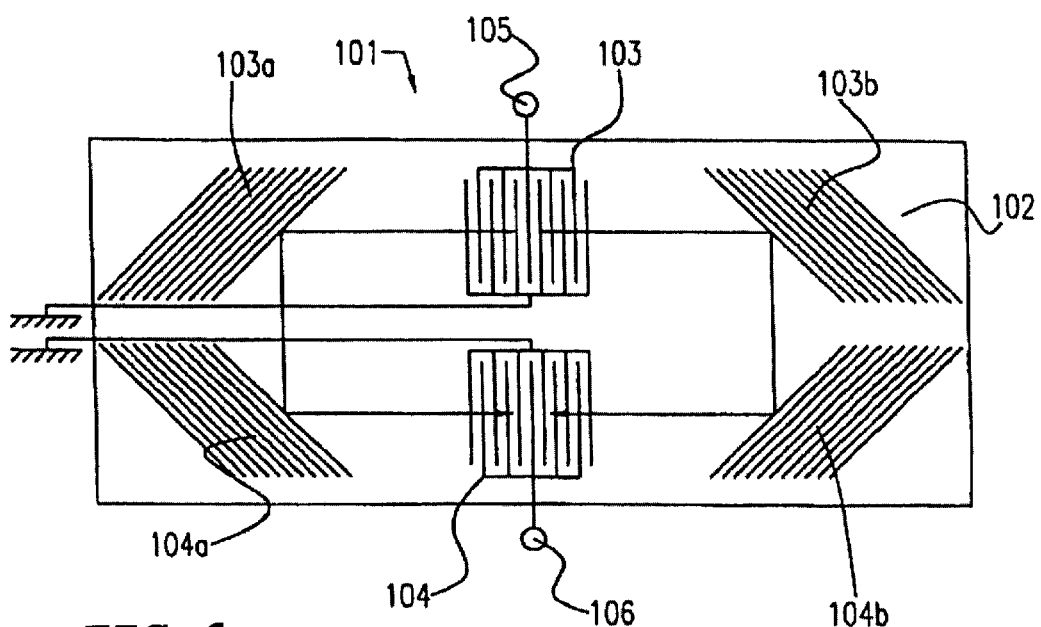
FIG. 5 is a plan view of a conventional surface acoustic wave filter.

Hereinafter, the frequency characteristic of the surface acoustic wave filter 1 will be described. FIG. 2 shows the frequency characteristic of the surface acoustic wave filter 1 shown in FIG. 1, measured under the same conditions as the frequency characteristic of the surface acoustic wave filter 101 having the conventional filters shown in FIG. 5 measured and graphed in FIG. 6.

Figure 6:
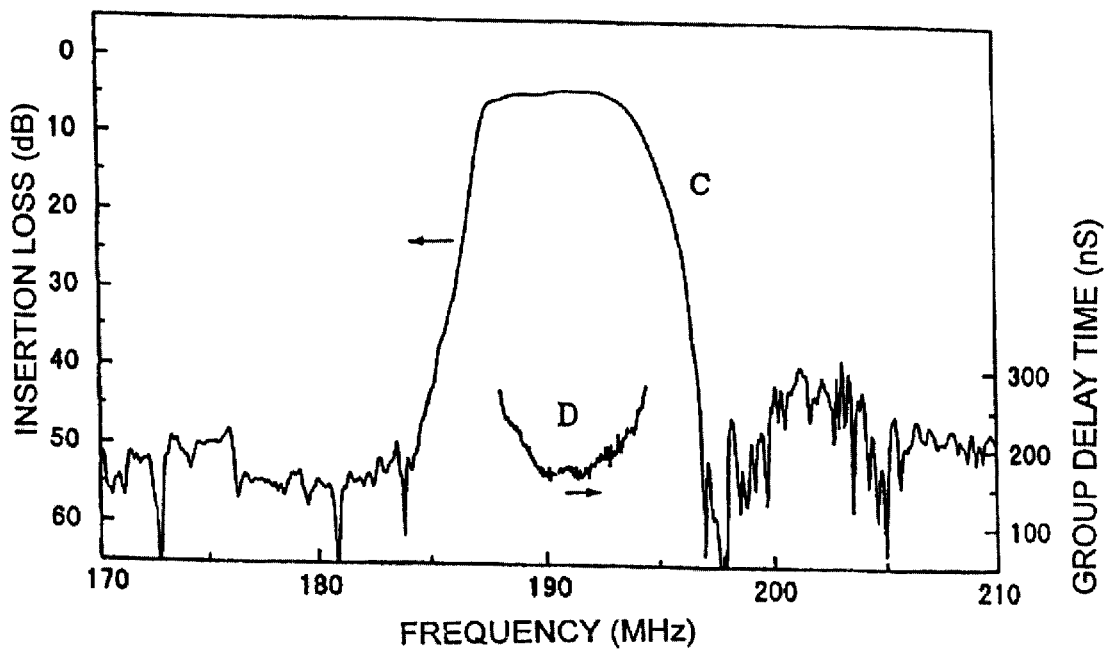
FIG. 6 is a graph showing the frequency characteristic and the group delay time characteristic of the conventional surface acoustic wave filter.

As shown in FIG. 2, as compared with the group delay time characteristic D in the pass-band of the frequency characteristic C of the surface acoustic wave filter 101 having reflectors shown in FIG. 6, the group delay time characteristic B in the pass-band of the frequency characteristic A of the surface acoustic wave filter 1 of preferred embodiments of the present invention becomes flat, and the deviation at the center frequency of ±3 MHz is about 60 nS, that is, is decreased to about 60% of the deviation of the conventional surface acoustic wave filter. Moreover, the reflection edges have a much greater reflection efficiency than a reflector including electrode fingers. The loss caused in the reflection portions can be minimized, and the propagation loss is very small due to the short propagation distance of an SH wave. Thus, the insertion loss in the pass band of the frequency characteristic A is improved by about 2.5 dB.

The reason for the flatness of the group delay time characteristic as described above is as follows. Regarding surface acoustic waves excited by the input electrode 103 shown in FIG. 5, surface acoustic waves to be propagated to the reflector 103b will be discussed. The difference between the propagation time of a surface acoustic wave reflected from the electrode finger on the left side end of the reflector 103b and extending to the IDT 104 on the output side, and that of a surface acoustic wave reflected on the electrode finger on the right side end of the reflector 103b and extending to the IDT 104 on the output side is large. On the other hand, in the configuration of FIG. 1, no time difference is caused by the reflection of the surface acoustic waves. As a result, the group delay time in the pass band becomes flat.

Figure 3:
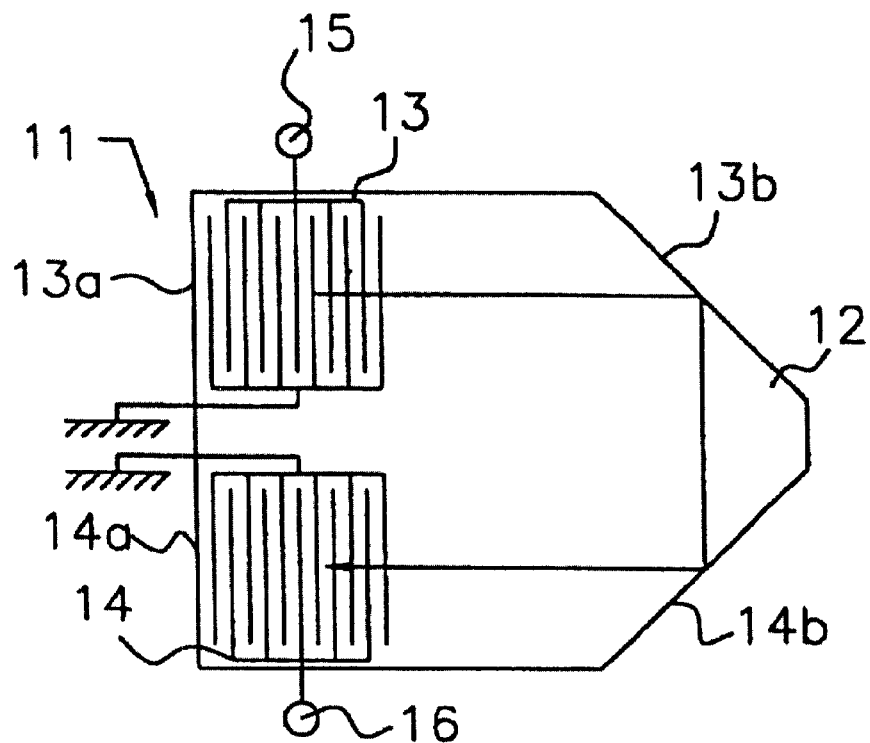
FIG. 3 is a plan view of a surface acoustic wave according to a second preferred embodiment of the present invention.

Hereinafter, a second preferred embodiment of the present invention will be described. FIG. 3 is a plan view of a surface acoustic wave filter 11 according to the second preferred embodiment.

The surface acoustic wave device 11 includes first and second IDTs 13 and 14 which are preferably made of an electrode material such as aluminum or other suitable material on a piezoelectric substrate 13 made of a piezoelectric ceramic or other suitable material that is polarized in the lateral direction, for example.

The first IDT 13 and the second IDT 14 are arranged substantially perpendicularly to the surface acoustic wave propagation direction. One of the interdigital electrodes of the first IDT 13 is connected to an input terminal 15, and the other interdigital electrode is grounded. One of the interdigital electrodes of the second IDT 14 is connected to an output terminal 16, and the other interdigital electrode is grounded.

A reflection edge 13a is disposed on one side of the first IDT 13 so as to be substantially parallel to the first IDT 13, so that a surface acoustic wave excited by the first IDT 13 is reflected toward the IDT 13. A reflection edge 13b that is inclined in the plan view of the piezoelectric substrate 12 is provided on the other side of the first IDT 13. The reflection edge 13b is arranged to define an angle at which a surface acoustic wave excited by the first IDT 13 is reflected from the reflection edge 13b in the direction about 90° different from the direction of incidence to the reflection edge 13b.

A reflection edge 14a is provided on one side of the second IDT 14 so as to be substantially parallel to the second IDT 14, so that a surface acoustic wave is reflected from the reflection edge 14a toward the second IDT 14. A reflection edge 14b that is inclined in the plan view of the piezoelectric substrate 12 is provided on the other side of the second IDT 14. The reflection edge 14b is arranged to define an angle at which the surface acoustic wave reflected from the reflection edge 13b is reflected from the reflection edge 14b in the direction about 90° different from the direction of incidence to the reflection edge 14b to be propagated.

Moreover, the distance between the center of the first reflection edge 13b and the center of the second reflection edge 14b of the piezoelectric substrate 12 is preferably about $\lambda/2 \times n$ (n is an integer) $\pm \lambda/8$. The symbol $\lambda$ represents the wavelength of a surface acoustic wave propagating on the piezoelectric substrate 12. Furthermore, the term "the center of the edge" means "the center of the reflection edge drawn in a line in the plan view of the piezoelectric substrate 12, e.g., as shown in FIG. 3." The phases of propagating surface acoustic waves are matched, and unnecessary spurious radiation is reduced by regulating the distance between the center of the first reflection edge 13b and the center of the second reflection edge 14b of the piezoelectric substrate 12.

Moreover, the distance between the center of the outermost electrode finger of the first IDT 13 and the center of the first reflection edge 13b, and the distance between the center of the outermost electrode finger of the second IDT 14 and the center of the second reflection edge 14b are preferably about λ/2×m (m is an integer) ±λ/8, respectively. The symbol "λ" represents the wave length of a surface acoustic wave to be propagated on the piezoelectric substrate 12. The term "the outermost electrode finger of the IDT" means "the electrode finger which is nearest to the reflection edge of the electrode fingers constituting the IDT". Moreover, the term "the center of the reflection edge" means "the center of the reflection edge drawn in a line in the plan view of the piezoelectric substrate 2, e.g., as shown in FIG. 3."

In the above-described surface acoustic wave filter 11, a surface acoustic wave is propagated as indicated by an arrow in FIG. 3. In particular, a signal is input via an input terminal 15, is excited by the first IDT 13, is propagated on the other side of the first IDT 13, and is reflected from the reflection edge 13b in the direction changed by about 90°. Moreover, the surface acoustic wave reflected from the reflection edge 13b is further reflected from the reflection edge 14b in the direction changed by about 90°, is received by the second IDT 14, and is output from an output terminal 16.

In this preferred embodiment, the reflection edges 13a and 14a are arranged so as to reflect a surface acoustic wave toward the first and second IDTs 13 and 14, respectively. Such arrangement is most preferable from the standpoint of loss and so forth. However, this arrangement is not absolutely required.

Figure 4:
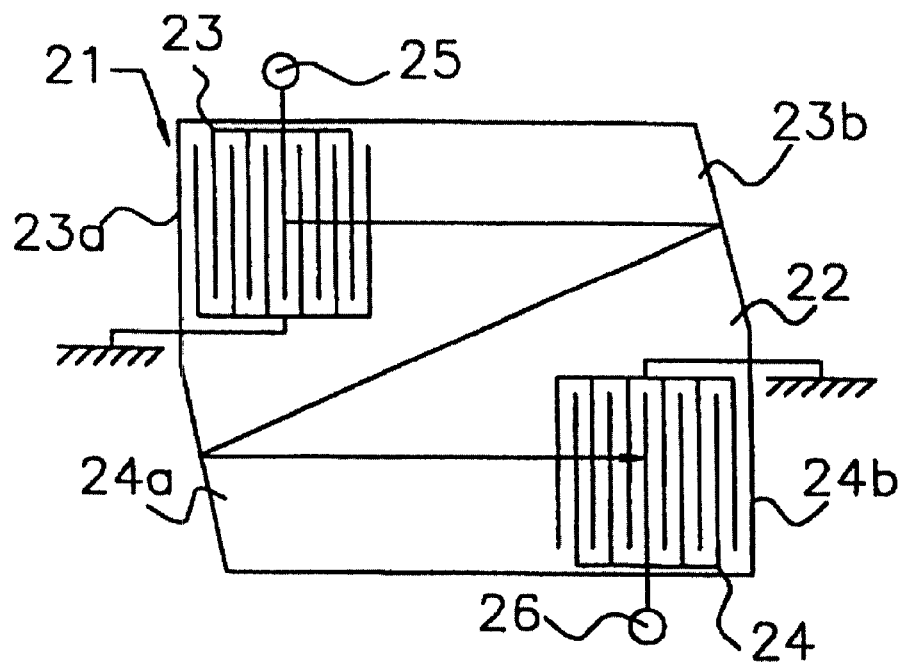
FIG. 4 is a plan view of a surface acoustic wave according to a third preferred embodiment of the present invention.

Hereinafter, a third preferred embodiment of the present invention will be described with reference to the drawing. FIG. 4 is a plan view of a surface acoustic wave filter 21 according to the third preferred embodiment of the present invention.

The surface acoustic wave device 21 includes first and second IDTs 23 and 24 preferably made of an electrode material such as aluminum or other suitable material, disposed on a piezoelectric substrate 22 polarized in the lateral direction, for example.

One of the interdigital electrodes of the first IDT 23 is connected to an input terminal 25, and the other interdigital electrode is grounded. One of the interdigital electrodes of the second IDT 24 is connected to an output terminal 26, and the other interdigital electrode is grounded.

A reflection edge 23a is provided on one side of the first IDT 23 so as to be substantially parallel to the first IDT 23, whereby a surface acoustic wave excited by the first IDT 23 is reflected from the reflection edge 23a toward the first IDT 23. Moreover, a reflection edge 23b is provided on the other side of the first IDT 23 so as to be inclined in the plan view of the piezoelectric substrate 22. In the example of FIG. 4, the reflection edge 23b is arranged to have an angle at which a surface acoustic wave excited by the first IDT 23 is reflected from the reflection edge 23b in the direction that is changed by about 30° from the direction of incidence to the reflection edge 23b to be propagated. It should be noted that the inclination of the reflection edge, which depends on the size of the substrate and the distance between the IDT and the reflection edge, is not limited to approximately 30° and can be changed.

A reflection edge 24a is provided on one side of the second IDT 24 so as to be inclined in the plan view of the piezoelectric substrate 22. The reflection edge 24a is arranged to define an angle at which the surface acoustic wave reflected from the reflection edge 23b is reflected from the reflection edge 24a in the direction being changed by about 30° from the direction of incidence to the reflection edge 24a. A reflection edge 24b is provided on the other side of the second IDT 24 so as to be substantially parallel to the second IDT 24, whereby the surface acoustic wave is reflected from the reflection edge 24b toward the second IDT 24.

Furthermore, the distance between the center of the first reflection edge 23b and the center of the second reflection edge 24a of the piezoelectric substrate 22 is preferably about λ/2×n (n is an integer) ±λ/8. The symbol "λ" represents the wavelength of a surface acoustic wave propagating on the piezoelectric substrate 22. The term "the center of the reflection edge" means "the center of the reflection edge drawn in a line in the plan view of the piezoelectric substrate 22, e.g., as shown in FIG. 4." The phases of propagating surface acoustic waves are matched, and unnecessary spurious radiation is minimized by regulating the distance between the center of the first reflection edge 23b and the center of the second reflection edge 24a of the piezoelectric substrate 22.

Moreover, the distance between the center of the outermost electrode finger of the first IDT and the center of the first reflection edge 23b, and the distance between the center of the outermost electrode finger of the second IDT 24 and the center of the second reflection edge 24a are preferably about λ/2×m (m is an integer) ±λ/8, respectively. The symbol "λ" represents the wavelength of a surface acoustic wave propagating on the piezoelectric substrate 22. The term "the outermost electrode finger of the IDT" means "the electrode finger nearest to the reflection edge of the electrode fingers constituting the IDT". Furthermore, the term "the center of the reflection edge" means "the center of the reflection edge drawn a line in the plan view of the piezoelectric substrate 2, e.g., as shown in FIG. 1."

In the above-described surface acoustic wave filter 21, a surface acoustic wave is propagated as directed by an arrow in FIG. 4. In particular, a signal is input via an input terminal 25, is excited by the first IDT 23, is propagated on the other side of the first IDT 23, is reflected from the reflection edge 23b in the direction that is changed by about 30°. Moreover, the surface acoustic wave reflected from the reflection edge 23b is reflected from the reflection edge 24a in the direction that is changed by about 30°, is received by the second IDT 24, and is output from an output terminal 26.

In this preferred embodiment, the reflection edges 23b and 24a are positioned so as to reflect a surface acoustic wave toward the first and second IDTs 23 and 24, respectively. These arrangements are most preferable from the standpoint of loss and other advantages, but are not restrictive.

In the above-described first to third preferred embodiments of the present invention, as the piezoelectric substrate, a piezoelectric ceramic is preferably used. However, this is not restrictive. Piezoelectric substrates made of lithium tantalate, lithium niobate, lithium tetraborate, Langasite, quartz, and other suitable material may also be used. Moreover, piezoelectric films made of zinc oxide, aluminum nitride, tantalum pentaoxide, or other suitable materials, disposed on substrates made of glass, sapphire, or other suitable materials may be used.

Moreover, in the first to third preferred embodiments, the first and second IDTs are preferably made of aluminum. This is not restrictive. Any conductive material such as gold, silver, copper, wolfram, tantalum, or others may also be used.

Figure 7:
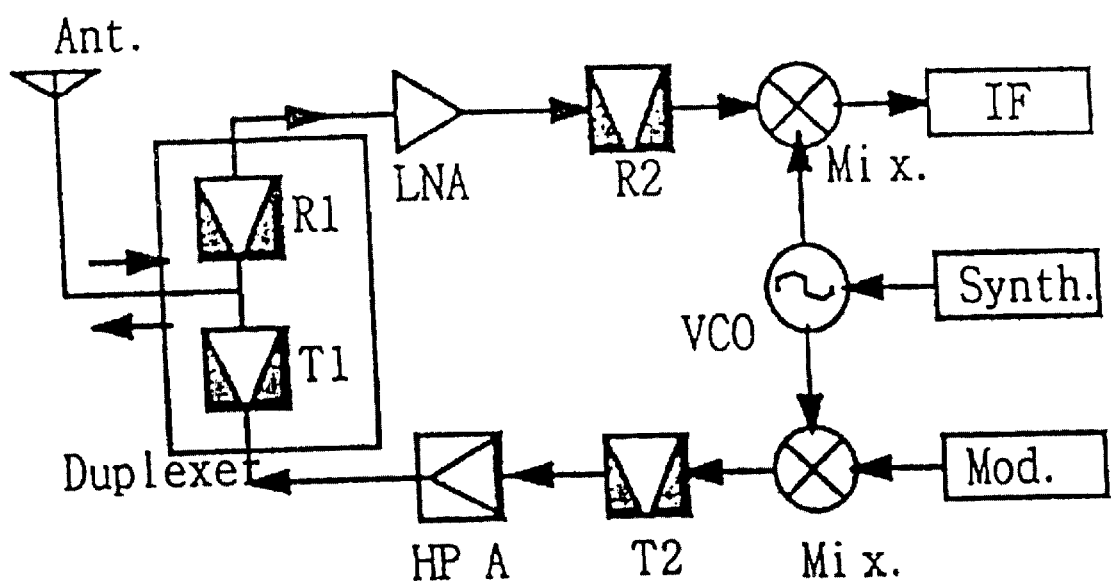
FIG. 7 is a schematic view of a communication apparatus according to another preferred embodiment of the present invention which includes a duplexer having a surface acoustic wave filter.

As shown in FIG. 7, a communication apparatus includes a duplexer having two surface acoustic wave filters T1 and R1 connected in parallel with phrase shift elements between the antenna Ant. and two filters T2 and R2. Each of the surface acoustic wave filters T1 and R1 is defined by a surface acoustic wave filter according to one of the first to third preferred embodiments of the present invention.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
   a piezoelectric substrate;
   a first IDT disposed on the surface of the piezoelectric substrate;
   a second IDT disposed on the surface of the piezoelectric substrate and arranged so as not to be located along a straight line with the first IDT in the direction of surface acoustic wave propagation;
   at least one first reflection edge defined by an edge of the piezoelectric substrate, and arranged along a straight line with the first IDT in the surface acoustic wave propagation direction, so that a shear horizontal surface acoustic wave excited by the first IDT is input to the at least one first reflection edge, and is reflected therefrom at an angle relative to the input direction; and
   at least one second reflection edge defined by an edge of the piezoelectric substrate and arranged along a straight line with the second IDT in the surface acoustic wave propagation direction, so that the shear horizontal surface acoustic wave reflected from the first reflection edge is input to the at least one second reflection edge, and is reflected therefrom at an angle relative to the input direction, toward the second IDT.

2. A surface acoustic wave filter according to claim 1, wherein the distance between the center of the at least one first reflection edge and the center of the at least one second reflection edge of the piezoelectric substrate is about $\lambda/2 \times n$ (n is an integer) $\pm \lambda/8$, in which $\lambda$ represents the wavelength of a surface acoustic wave propagating the piezoelectric substrate.

3. A surface acoustic wave filter according to claim 1, wherein the distance between the center of the outermost electrode finger in the first IDT and the center of the at least one first reflection edge is about $\lambda/2 \times m$ (m is an integer) $\pm \lambda/8$, in which $\lambda$ represents the wavelength of a surface acoustic wave propagating the piezoelectric substrate.

4. A surface acoustic wave filter according to claim 1, wherein the distance between the center of the outermost electrode finger in the second IDT and the center of the at least one second reflection edge is about $\lambda/2 \times m$ (m is an integer) $\pm \lambda/8$, in which $\lambda$ represents the wavelength of a surface acoustic wave propagating the piezoelectric substrate.

5. A surface acoustic wave filter according to claim 1, wherein the first and second IDTs are made of Al.

6. A surface acoustic wave filter according to claim 1, wherein the piezoelectric substrate is made of a piezoelectric ceramic material.

7. A surface acoustic wave filter according to claim 1, wherein the piezoelectric substrate includes a pair of the first reflection edges and a pair of the second reflection edges.

8. A surface acoustic wave filter according to claim 7, wherein the pair of first reflection edges are provided on both sides of the first IDT.

9. A surface acoustic wave filter according to claim 7, wherein the pair of second reflection edges are provided on both sides of the second IDT.

10. A surface acoustic wave filter according to claim 7, wherein the pair of first reflection edges are arranged to have an angle at which surface acoustic waves excited by the first IDT are reflected from the pair of first reflection edges in the reflection directions that are about 90° different from the directions of incidence to the pair of first reflection edges.

11. A surface acoustic wave filter according to claim 7, wherein the pair of second reflection edges are arranged to have an angle at which surface acoustic waves excited by the first IDT are reflected from the pair of second reflection edges in the reflection directions that are about 90° different from the directions of incidence to the pair of second reflection edges.

12. A surface acoustic wave filter according to claim 7, wherein the pair of first reflection edges are arranged such that one of the pair of first reflection edges is substantially parallel to the first IDT and the other of the pair of first reflection edges is arranged to have an angle at which a surface acoustic wave excited by the first IDT is reflected from the reflection edge in the direction that is changed by about 30° from the direction of incidence to the reflection edge.

13. A surface acoustic wave filter according to claim 7, wherein the pair of second reflection edges are arranged such that one of the pair of second reflection edges is substantially parallel to the second IDT and the other of the pair of second reflection edges is arranged to have an angle at which a surface acoustic wave excited by the second IDT is reflected from the reflection edge in the direction that is changed by about 30° from the direction of incidence to the reflection edge.

14. A duplexer comprising the surface acoustic wave filter according to claim 1.

15. A communication device comprising the duplexer according to claim 14.

16. A communication device comprising the surface acoustic wave filter according to claim 1.

* * * * *